(12) United States Patent
Ullom

(10) Patent No.: US 10,430,997 B2
(45) Date of Patent: *Oct. 1, 2019

(54) METHOD OF MANAGING PROXY OBJECTS

(71) Applicant: OPTO Interactive, LLC, Fort Lauderdale, FL (US)

(72) Inventor: Richard T. Ullom, Fort Lauderdale, FL (US)

(73) Assignee: OPTO Interactive, LLC, Fort Lauderdale, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/225,755

(22) Filed: Dec. 19, 2018

(65) Prior Publication Data

US 2019/0122426 A1 Apr. 25, 2019

Related U.S. Application Data

(63) Continuation-in-part of application No. 15/903,758, filed on Feb. 23, 2018, now Pat. No. 10,198,863.

(60) Provisional application No. 62/462,665, filed on Feb. 23, 2017.

(51) Int. Cl.

| | |
|---|---|
| *G06T 17/00* | (2006.01) |
| *G06T 7/70* | (2017.01) |
| *G06T 17/50* | (2006.01) |
| *G06T 15/06* | (2011.01) |
| *G06F 16/51* | (2019.01) |
| *G06F 3/0482* | (2013.01) |
| *G06F 17/50* | (2006.01) |

(52) U.S. Cl.
CPC ............ *G06T 17/00* (2013.01); *G06F 3/0482* (2013.01); *G06F 16/51* (2019.01); *G06F 17/50* (2013.01); *G06T 7/70* (2017.01); *G06T 15/06* (2013.01)

(58) Field of Classification Search
None
See application file for complete search history.

(56) References Cited

U.S. PATENT DOCUMENTS

| | | | |
|---|---|---|---|
| 6,664,972 B2 | 12/2003 | Eichel et al. | |
| 6,727,925 B1 | 4/2004 | Bourdelais | |
| 7,193,633 B1 | 3/2007 | Reinhardt et al. | |
| 7,277,572 B2 | 10/2007 | MacInnes et al. | |
| 7,523,411 B2 | 4/2009 | Carlin | |

(Continued)

FOREIGN PATENT DOCUMENTS

EP 2208185 6/2013

*Primary Examiner* — Peter Hoang
(74) *Attorney, Agent, or Firm* — McHale & Slavin, P.A.

(57) ABSTRACT

A method of managing Proxy Objects by attaching Meta Data to each Proxy and HD Object. The Meta Data enables the user to programmatically swap one Proxy Object with one or more HD Objects. All Proxy Objects and HD Objects are stored in a secure database structure that protects the content owner's intellectual property while providing access by users to the proxy objects and all related product information. Non-technical and non-CAD users can configure objects within a space by selecting an object, browsing a catalog of possible alternative objects, viewing specific product details and then selecting the object to replace the selected object. Once a new object is selected, a photo realistic 360 image of a scene is created in real time without any special software on the user's computer or any special training.

14 Claims, 15 Drawing Sheets
(5 of 15 Drawing Sheet(s) Filed in Color)

(56) References Cited

U.S. PATENT DOCUMENTS

| | | |
|---|---|---|
| 2004/0113945 A1 | 6/2004 | Park et al. |
| 2005/0081161 A1 | 4/2005 | MacInnes et al. |
| 2006/0101742 A1 | 5/2006 | Scott-Leikach et al. |
| 2008/0174598 A1 | 7/2008 | Risenhoover |
| 2009/0099832 A1 | 4/2009 | Nasle |
| 2011/0137892 A1 | 6/2011 | Bisson et al. |
| 2015/0193982 A1 * | 7/2015 | Mihelich et al. |
| 2015/0310135 A1 * | 10/2015 | Forsyth ............... G06F 17/5004 703/1 |
| 2016/0048497 A1 | 2/2016 | Goswami |

\* cited by examiner

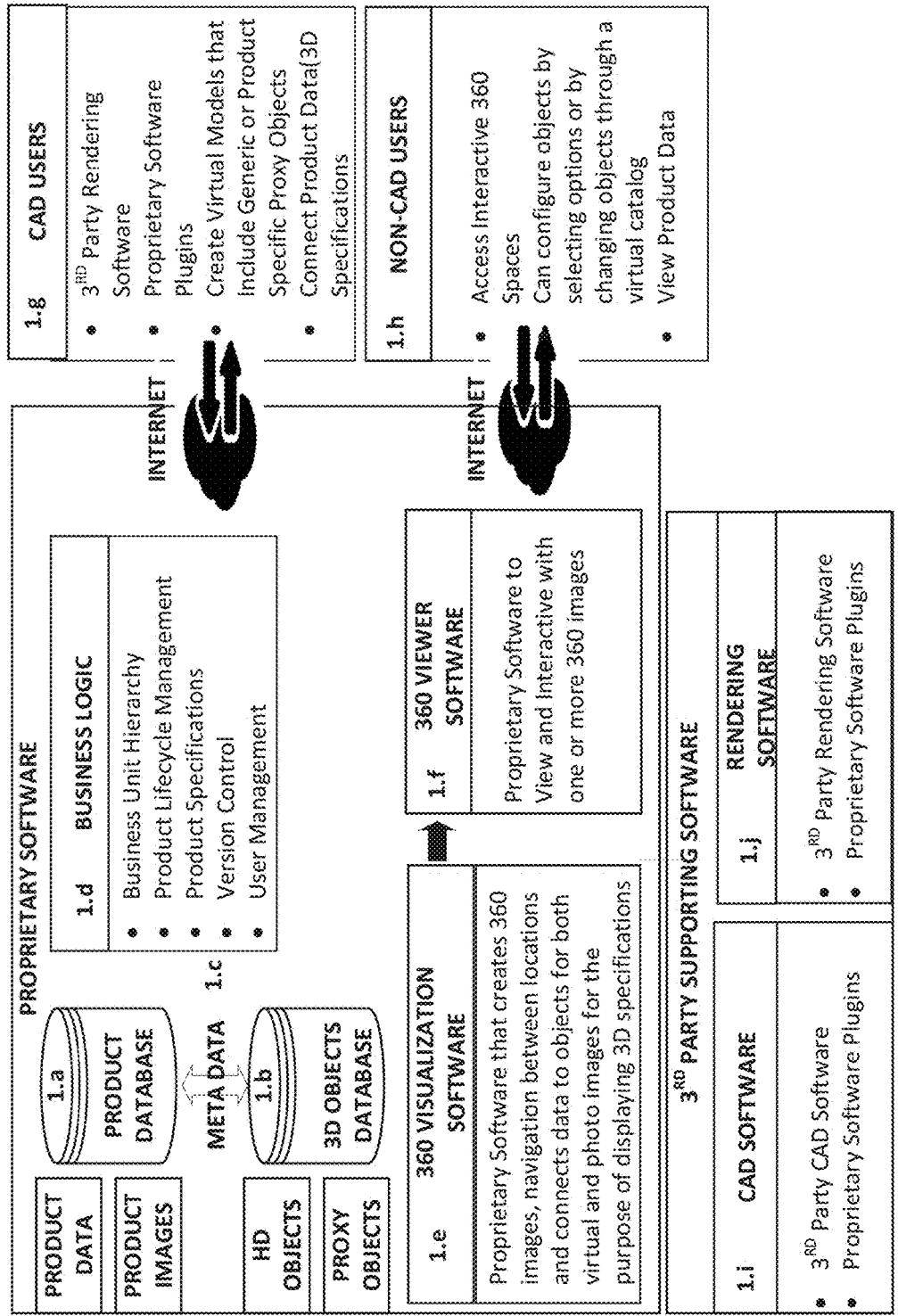
Figure 1: Summary

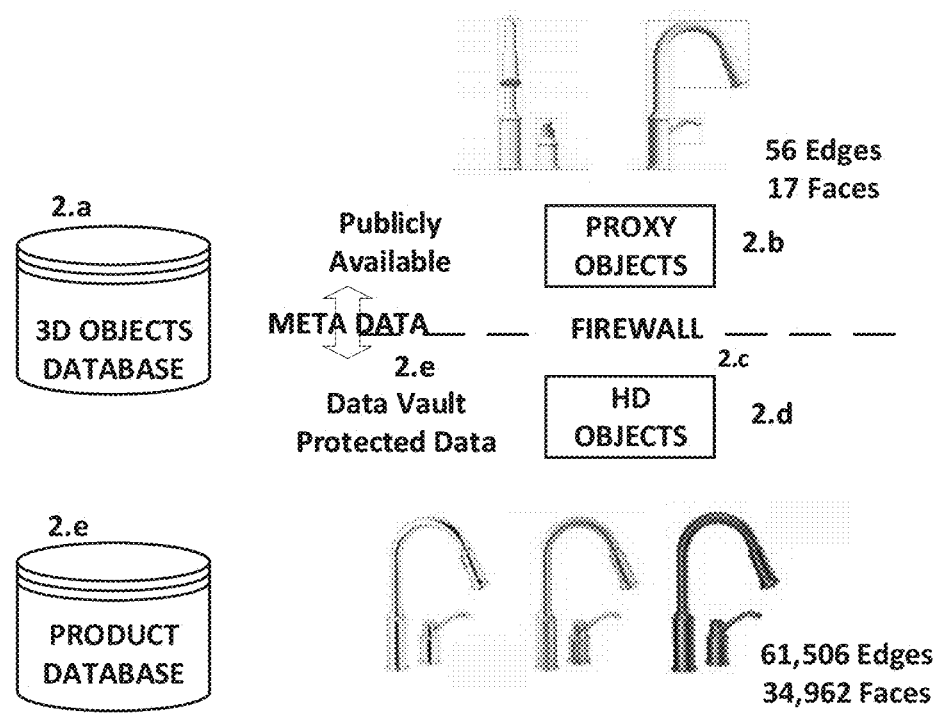
Figure 2: Protecting Content Owner's IP

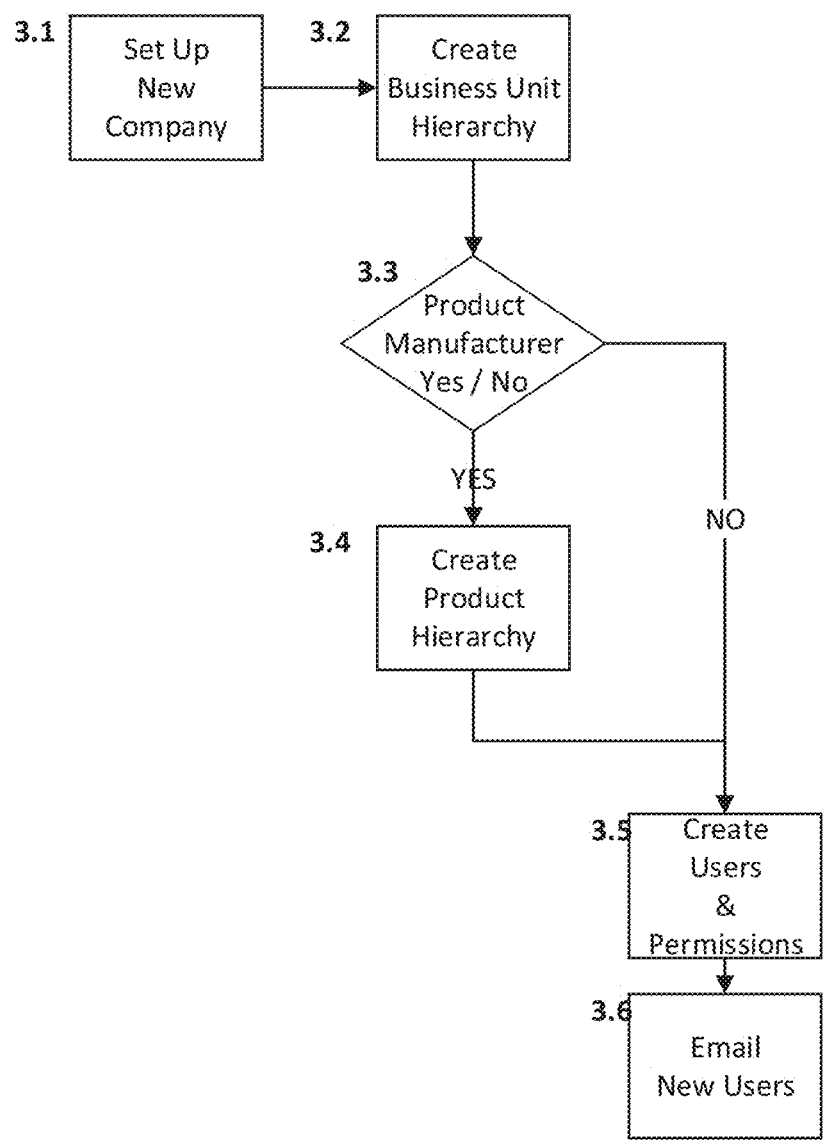

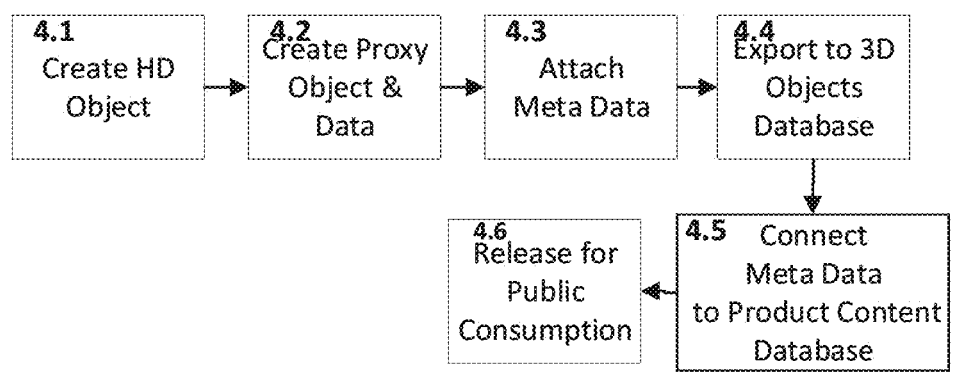
Figure 4: Creating New 3D Objects

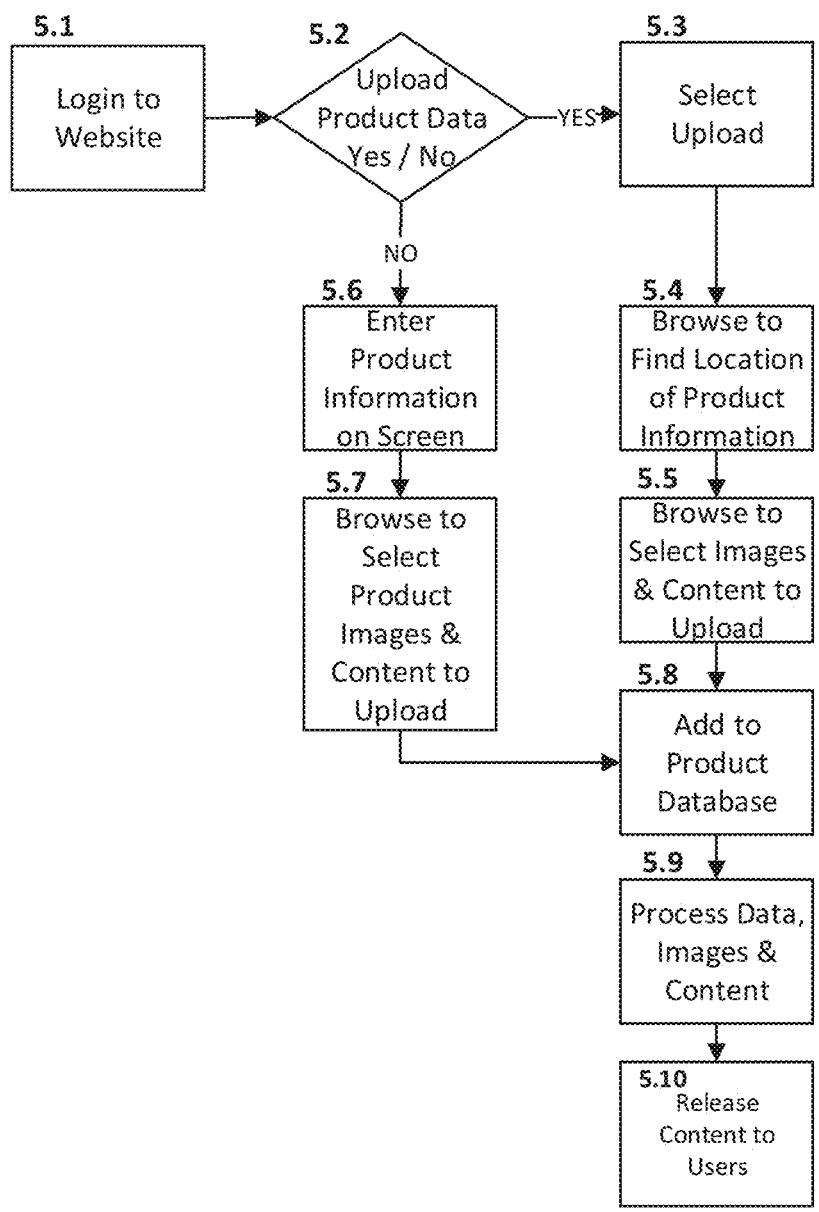

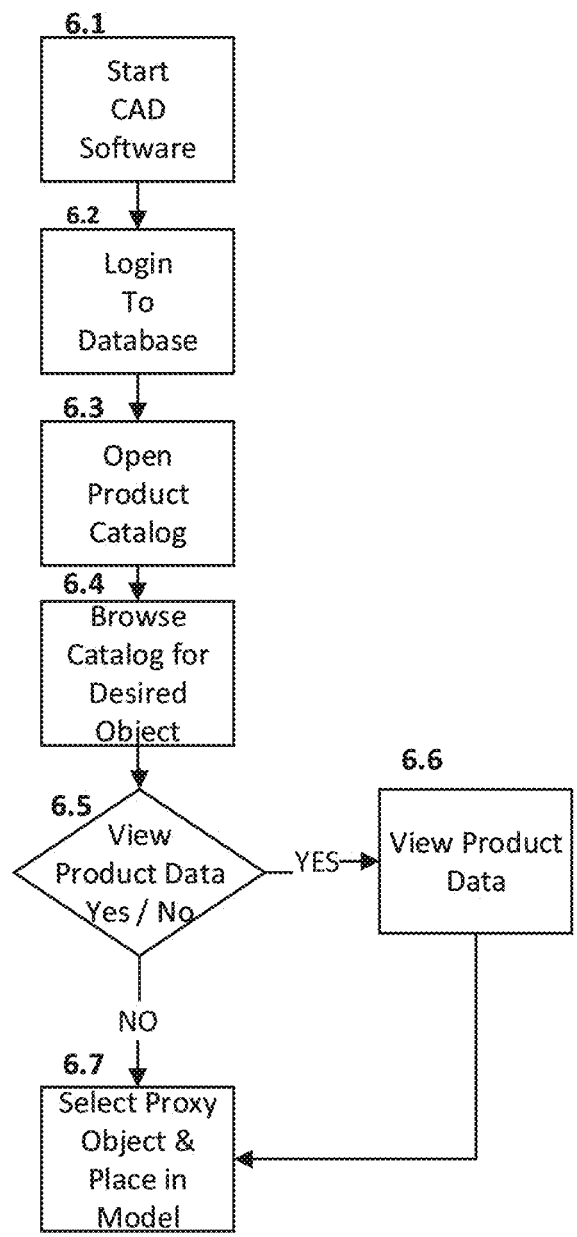

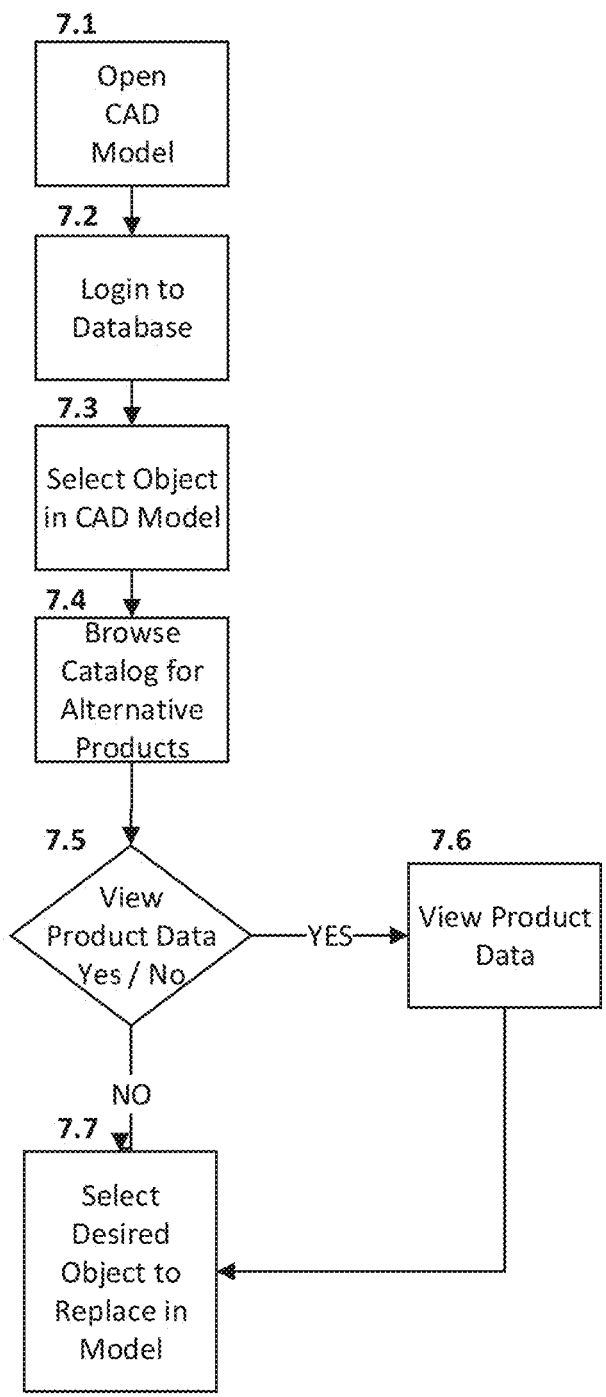

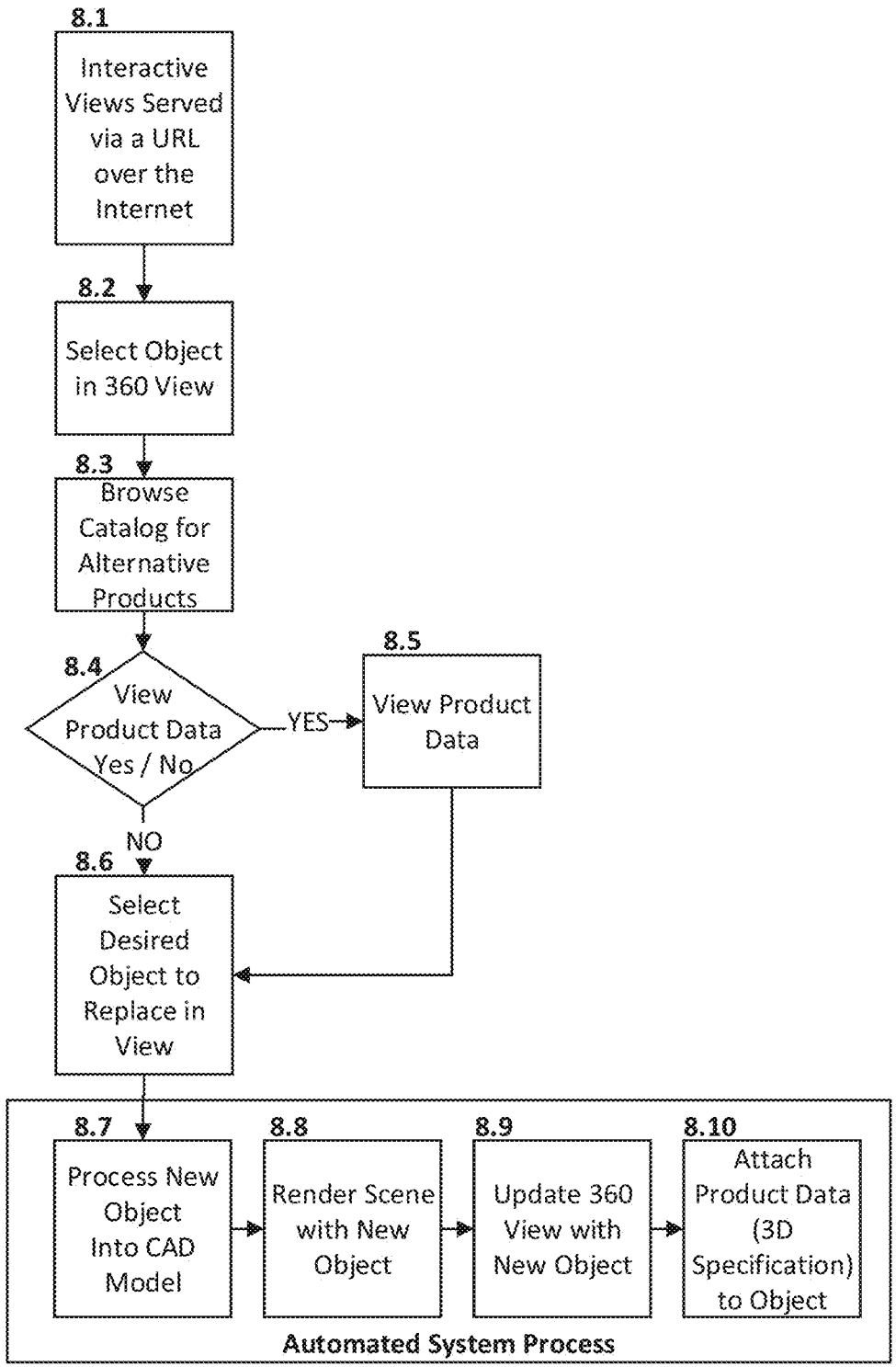

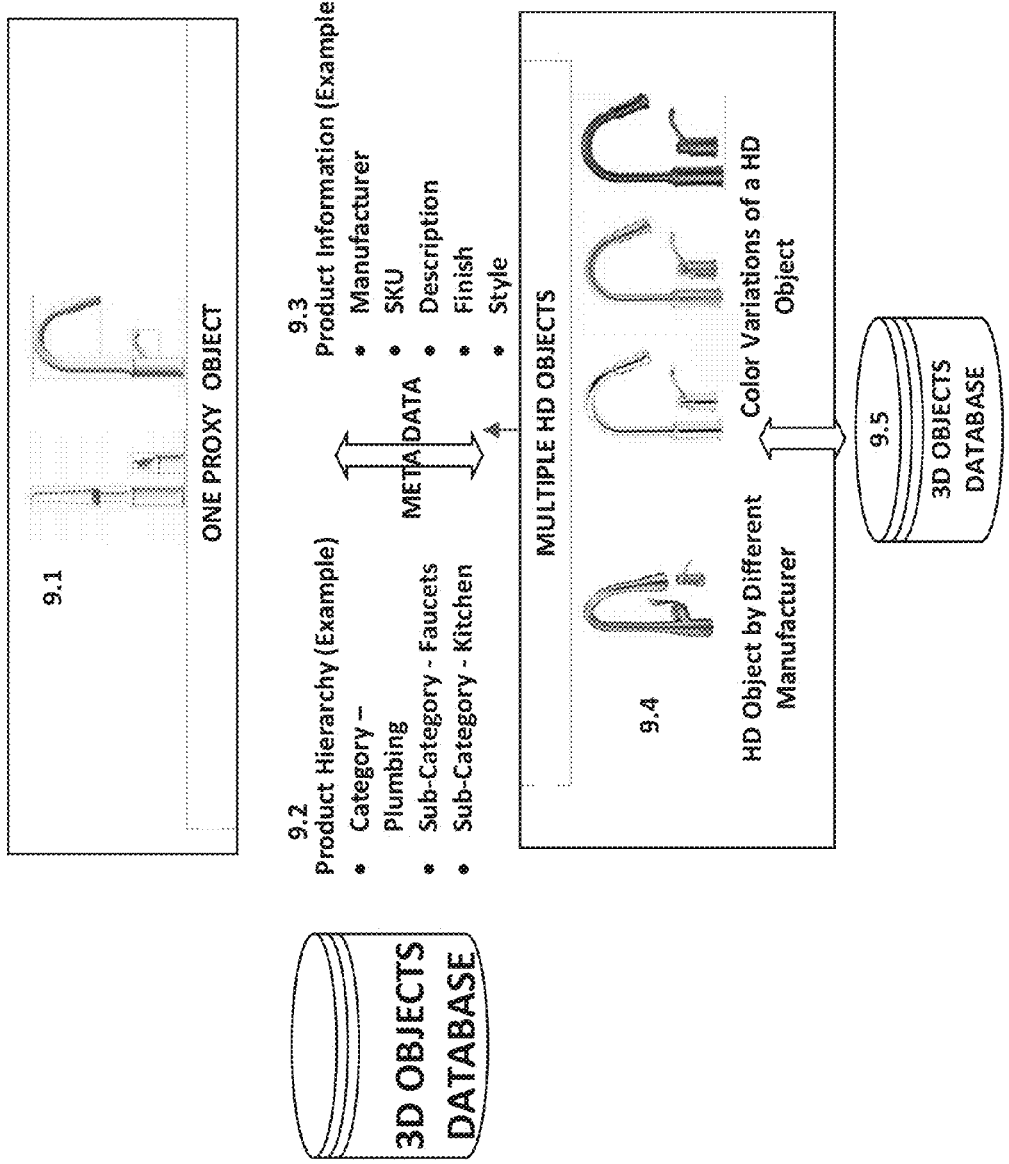

Figure 10: Swapping Object in 360 Viewer Software Example
10.a
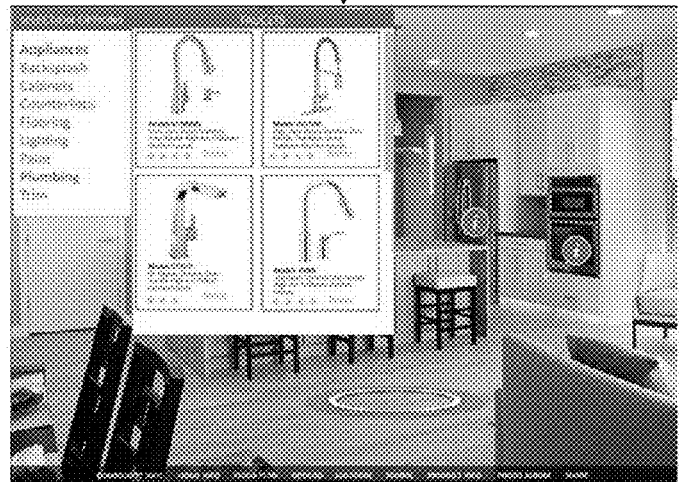
10.b
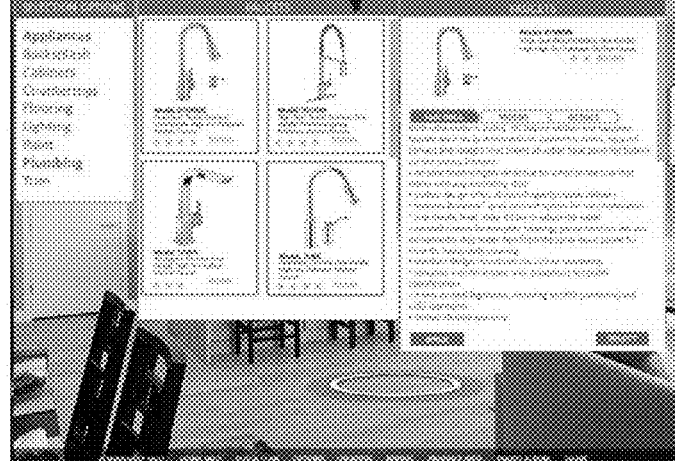
10.c

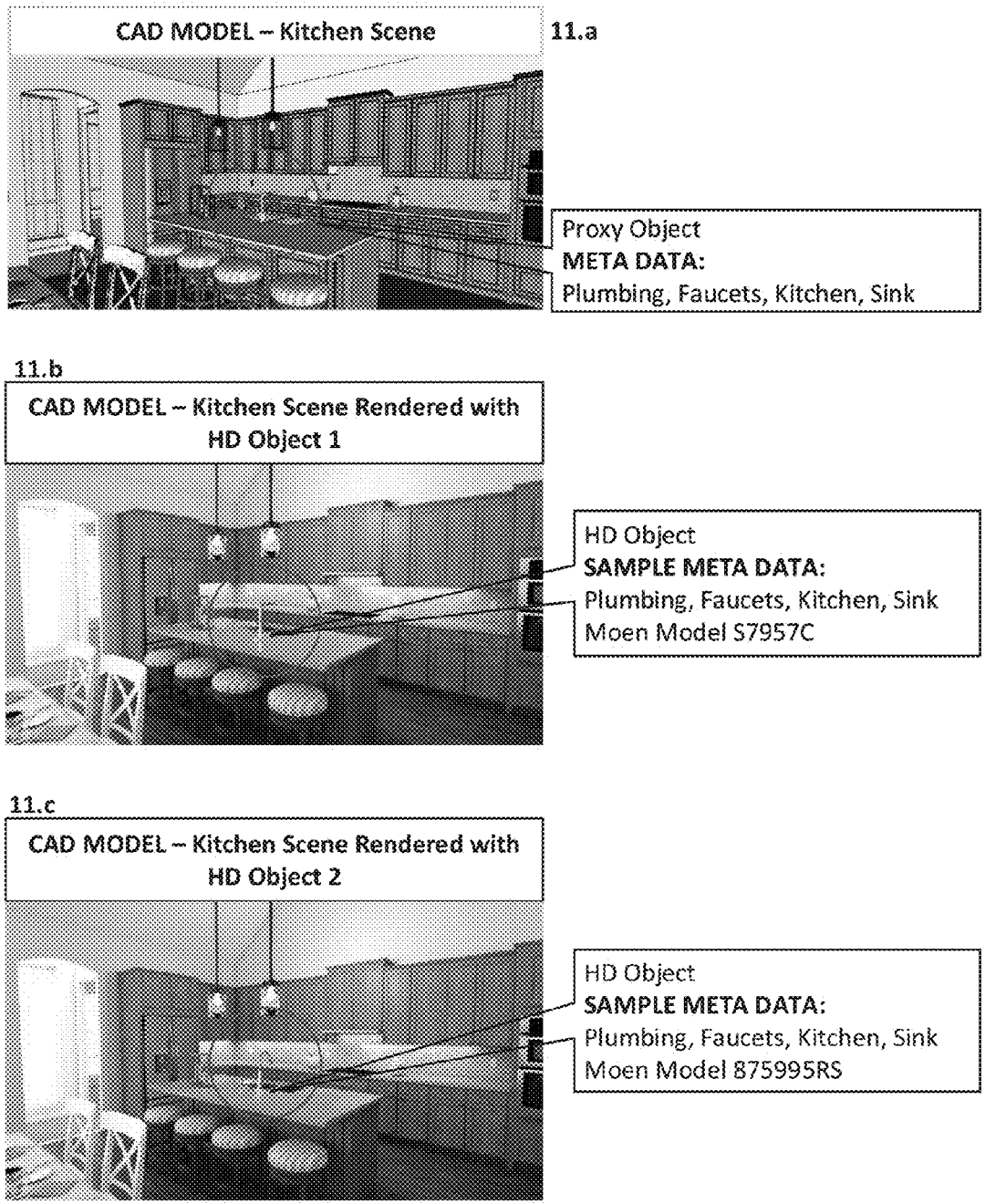

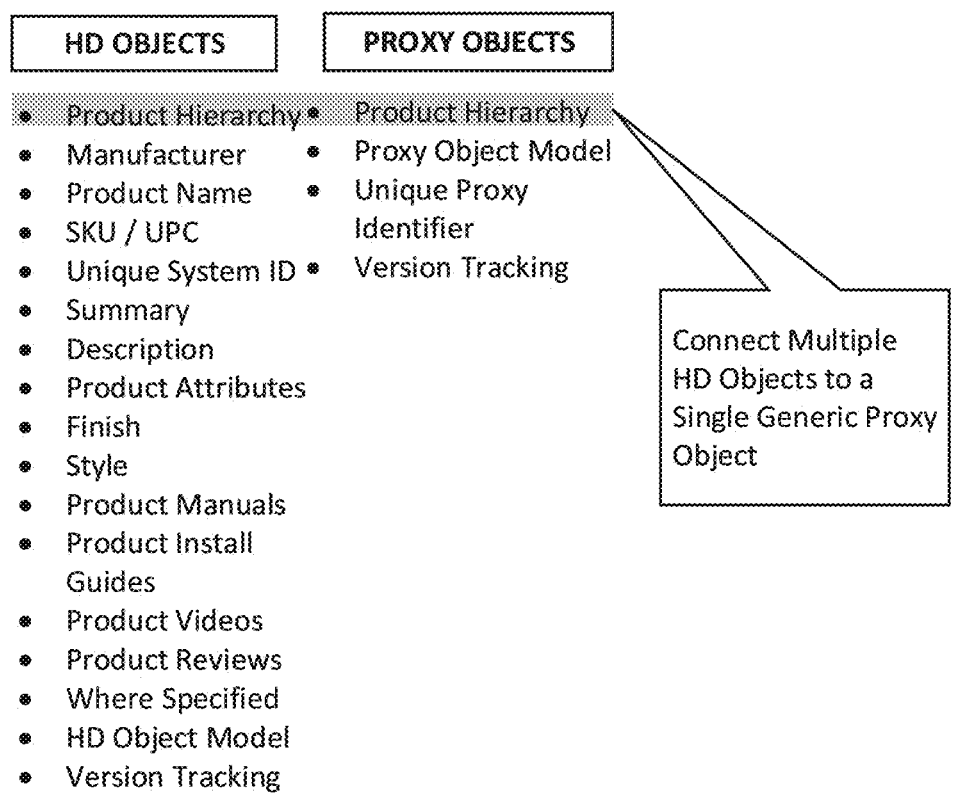

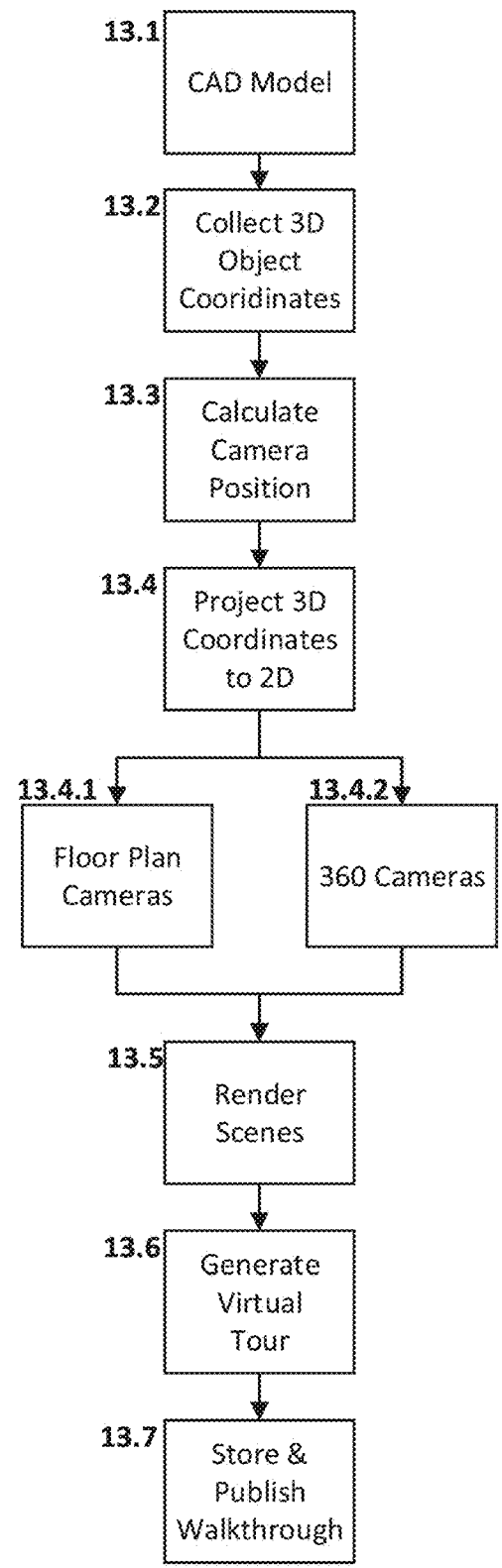
Figure 13: Automatic Generation of Virtual Tour from CAD Model

Figure 14: Example of Dynamically Managing Menu Structure for 3D Object and Product Data
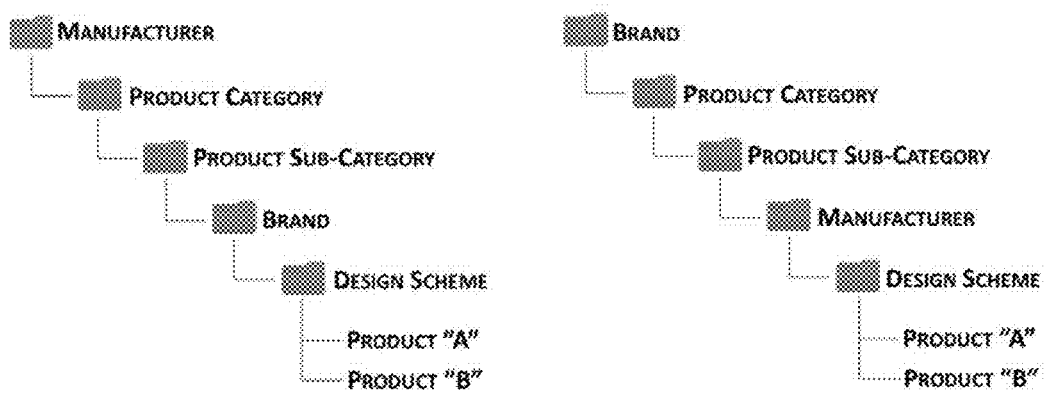
Folders are simply views into the data which are based on the Meta Data. Users can structure the folder views to meet their specific needs. The examples above show two options for viewing the same data.

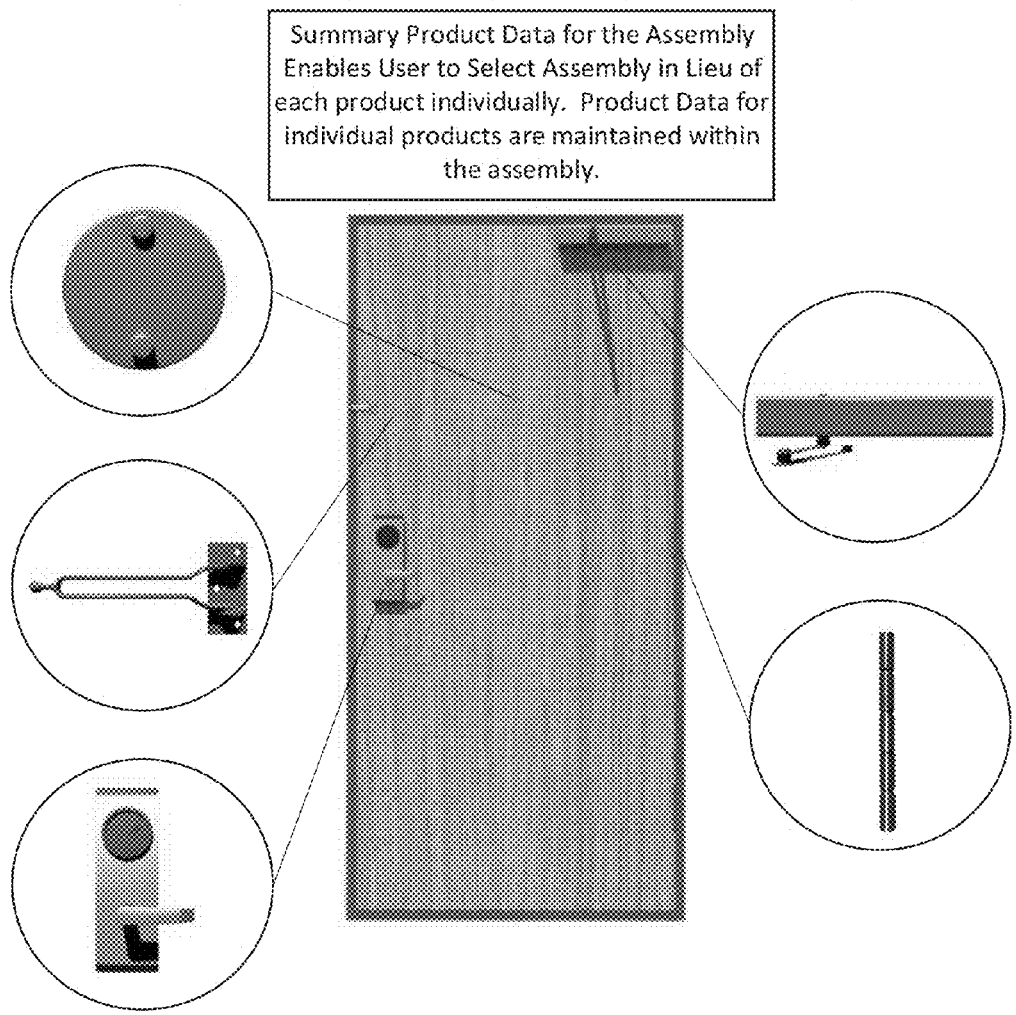
Figure 15: Example of 3D Object and Product Data Assembly

METHOD OF MANAGING PROXY OBJECTS

PRIORITY APPLICATION

In accordance with 37 C.F.R. § 1.76 a claim of priority is included in an Application Data Sheet filed concurrently herewith. Accordingly, the present invention is a continuation-in-part application of U.S. patent application Ser. No. 15/903,758, entitled "METHOD OF MANAGING PROXY OBJECTS", filed Feb. 23, 2018, which claims priority to U.S. Provisional Patent Application No. 62/462,665 entitled "METHOD OF MANAGING PROXY OBJECTS," filed Feb. 23, 2017. The contents of the above referenced applications are incorporated herein by reference.

FIELD OF THE INVENTION

The present invention concerns computer generated images and related product data. In particular, the present invention concerns improving the process of managing objects within CAD Models and generating computer generated images with related product data which is available as a 3D Specification.

BACKGROUND OF THE INVENTION

Computer Aided Design ("CAD") software has been widely used to create virtual models of buildings and products for decades. In addition, Computer Generated Images (CGI) have been used to create virtual images from video games to movies and virtual worlds. The existing processes are cumbersome, creating large files which are problematic to share and move from user to user and require a tremendous amount of storage and computer power to process into photo realistic renderings. In addition, the CAD files and CGI files have competing needs, which makes it difficult for users to efficiently create photo realistic images without tremendous computing power. The CAD files, ideally, need to be small to be efficient for users to save and share; while the CGI files need rich data to be able to create photo realistic images. Attempts have been made to address the file size issue by introducing Proxy Objects into the CAD model. Proxy Objects are light weight objects with limited detail and smaller file size as compared to large weight HD Objects with maximum detail and larger file size.

Current solutions link a single Proxy Object to a single HD Object which are memory intensive as they have all the details required to create a photo realistic image once rendered. Advancements in computer hardware are decreasing the time to produce photo realistic images. While the current solutions help address the file size issue, they require individual users to manually create a Proxy Object for each HD Object. If a user wants to change the HD Object, the user is required to change the Proxy Object manually within the CAD model and then re-render the scene which requires the user to have specific software, hardware and specific technical skills.

Many manufacturers have made their HD CAD Objects available publicly to help CAD users include their products in CAD Models. However, once a user has the manufacturer's HD Object, they have all the details of how the product is designed. However, in doing so, the manufacturers are giving their intellectual property to users without regard to how the public may use their information. This is very similar to the early days of music being made available online where users were able to copy and share music with little or no control by the music's owner. Users copied and shared music freely, creating a major problem for music owners.

The current solutions are not practical for many applications. For example, a user who wants to create a CAD model of a single-family home and show alternative appliances, cabinets, countertops, backsplashes, light fixtures, flooring and paint colors could easily have more than 400 million combinations. This is not practical and is the main reason that home builders have not been able to virtually model alternative selections for consumers with photo quality rendering. Similar scalability issues exist for commercial designers and architects who need to model multiple combinations of selections and retailers who must rely on actual photography to represent their products on line.

While Proxy Objects have existed for years and make the CAD models more efficient, all Proxy Objects have been associated only with a single HD Object in a one-to-one relationship. This limits the ability to scale and requires a CAD user to modify the CAD model each time they want to modify the output of the CAD file. What is lacking in the industry is a method of managing light weight Proxy Objects and connecting a generic proxy object to one or more HD Objects using Meta Data.

Currently the 3D objects in CAD Models are disconnected from the product information. Users construct buildings using 2D paper plans with 2D specifications. Matching the details on the plans with the specifications details is cumbersome and time consuming. BIM models offered the promise of solving much of these issues by creating 3D Models of buildings with content information. However, this shifted the burden from the contractors matching manual information to the architects building this information within BIM models and most architects don't take the time to add the product information within a BIM. In addition, a BIM requires specialized software, hardware and training to use.

The Product Data is not connected digitally with the 3D objects and there is no system in place to manage the Product Lifecycle—meaning that end users don't have any way to know if a product is still available or if it will be discontinued at some future date. Additionally, once a manufacturer discontinues a product, they typically delete all references to that product on their website. This makes it very difficult for end users to research product information on products that have been installed.

SUMMARY OF THE INVENTION

Disclosed is a method of managing Proxy Objects by an application executing on a computer device for attaching Meta Data to each Proxy and HD Object. The Meta Data enables the user to programmatically swap one Proxy Object with one or more HD Objects. All Proxy Objects and HD Objects are stored in a secure database and related via Meta Data.

An objective of the invention is to swap various Proxy Objects—each for one or more HD Objects.

Another objective of the invention is to prevent the complete disclosure of manufacturer's HD Object CAD files by providing Proxy Objects for Scene creation while protecting the HD Object in a Data Vault.

Another objective of the invention is to connect manufacturers' product data (including images, videos, product information and related documents provided by a manufacturer) with each HD Object to create a 3D Specification for users to access visually directly from within a CAD Model or a Scene.

Another objective of the invention is to reduce the storage space required for displaying virtual and interchangeable models used to create photo realistic renderings. The use of Proxy Objects also reducing the need for high speed internet access and computer processors used in the substitution of Proxy Objects for HD Objects.

Another objective of the invention is to enable non-technical users to swap HD Objects within a 360 view and obtain updated 360 photo realistic renderings with 3D Specifications in the 360 View. Users with the correct permissions can view the product history which includes previous 3D objects and associated product data.

Other objectives and further advantages and benefits associated with this invention will be apparent to those skilled in the art from the description, examples and claims which follow.

BRIEF DESCRIPTION OF THE DRAWINGS

The patent or application contains at least one drawing executed in color. Copies of this patent or patent application publication with color drawings will be provided by the Office upon request and payment of the necessary fee.

FIG. 1 is a summary flow chart of the ecosystem used in this invention.

FIG. 2 is a pictorial illustrating the protecting content owner's intellectual property.

FIG. 3 is a flow chart illustrating setting up a new company and users.

FIG. 4 is a flow chart illustrating the process for creating new 3D objects.

FIG. 5 is a flow chart illustrating the process for adding product data to the Product Database.

FIG. 6 is a flow chart illustrating the process for adding Proxy Objects to a CAD Model.

FIG. 7 is a flow chart illustrating the process for swapping Objects in a CAD Model.

FIG. 8 is a flow chart illustrating the process for swapping Objects in 360 Interactive Views Over the Internet.

FIG. 9 is a pictorial illustrating the relationship between One Proxy Object and Many HD Objects.

FIG. 10 is a pictorial illustrating the process for swapping Objects in the 360 Viewer Software.

FIG. 11 is a pictorial illustrating Swapping an Object in a CAD Model.

FIG. 12 is a chart illustrating the Meta Data Relationship between Proxy Objects and HD Objects.

FIG. 13 is a flowchart illustrating the process for automatically generating a 360 tour from a CAD Model FIG. 14 is an example of dynamically managing menu structure for 3D Objects and Product Data.

FIG. 15 is an example of a 3D Object and Product Data Assembly.

DETAILED DESCRIPTION OF THE PREFERRED EMBODIMENT

Detailed embodiments of the instant invention are disclosed herein; however, it is to be understood that the disclosed embodiments are merely exemplary of the invention, which maybe embodied in various forms. Therefore, specific functional and structural details disclosed herein are not to be interpreted as limiting, but merely as a basis for the claims and as a representation basis for teaching one skilled in the art to variously employ the present invention in virtually any appropriately detailed structure.

Set forth is the method of managing Proxy Objects by attaching Meta Data to each Proxy and HD Object. The Meta Data enables us to programmatically swap one Proxy Object with many possible HD Objects. All Proxy Objects and HD Objects are stored in a database and related via the Meta Data. The HD Objects provided by product manufacturers contain intellectual property "IP". Manufacturers can upload the HD Objects, related Meta Data and Product Data to a Data Vault programmatically or through a graphical user interface over the Internet or they can connect to the invention via an API developed by inventor to connect product stored in a manufacturer's database with the 3D Proxy and HD Objects. The System connects each HD Object to the appropriate Proxy Object using the Meta Data (see FIG. 12), and protects the HD Object CAD information in the Data Vault (see FIG. 2). The Data Vault is only accessible by each manufacturer's authorized users and a controller's software to protect each manufacturer's HD Objects in much the same way music services like iTunes protect music owners' content. End users never have access to the manufacturers' HD CAD Objects.

As an example, FIG. 4 illustrates the process for creating 3D Objects. Once an Object is released for use, a CAD User can add a Proxy Object for a faucet in a CAD model by browsing the product catalog (see FIG. 6). The Proxy Object is only a rough representation of an actual faucet offered by a manufacturer. The Meta Data connects a Proxy Object to one-or-more HD Objects (see FIG. 9). Using Meta Data, a CAD User or a Non-CAD User can swap the Proxy Object for a specific HD Object by selecting a specific Object from the Product Catalog (see FIG. 7 for CAD Model process and FIG. 8 for non-CAD Model process). The System provides a visual representation of the HD Object selected but maintains the Proxy Object in the CAD Model to protect the IP while enabling the user to view 3D Specification. The CAD User can render the scene using $3^{rd}$ Party rendering software at which time the system switches the Proxy Object for the correct HD Object and provides a photo realistic image of the scene with the HD Object (see FIG. 11). For Non-CAD Users, the Scene is presented through a web-browser or mobile app. The Non-CAD user can select an Object, browse a product catalog to swap the object and select the object. Then the System automatically switches the HD Object with the one selected by opening the CAD Model swapping the Objects, rendering the new Scene and then displays the Scene with the new Object and corresponding 3D Specification (see FIG. 10).

Referring to FIG. 1 the product database stores all product information including, but not limited to product specifications, product attributes, product images, product installation guides, product videos and product dimensions. The product database contains data from all manufacturers that are in the network. Manufacturers can use the Product Data API developed as part of this invention to connect product information from within their own database(s) with the 3D Object database. The data within the product database or connected via the Product Database API is managed through the business logic layer and is converted to 3D Specifications for viewing by Users at the time they select an Object whether in the CAD Model or through the 360 viewer software.

The 3D objects database stores all the product CAD models which include proxy objects and HD objects. Each object contains meta data that connects the proxy objects to the related product content. Meta data connects the product information with the 3D objects and is also used to sort and filter data for end users. The business logic is the application layer to the invention and it manages the business unit hierarchy, product specifications, the product lifecycle, version control, specifying products for use within the product hierarchy and specific CAD models and swapping proxy objects.

The 360 visualization software takes 360 panoramic photographic or 360 panoramic virtual images and convert them into viewable images in the 360 viewer software. In addition, this software converts 3D coordinates from within the CAD model into 2D coordinates which enables the visualization software to automatically place icons for movement from one camera location to another and to automatically places icons that enable users to select objects to view product information or swap objects based upon the business logic. The 360 Viewer Software presents the 360 panoramic images to end users through a web browser or mobile app. The viewer software enables users to move from one panoramic image to another (as if they are walking through a space) and to select objects to view product information known as a 3D Specification or swap with other objects in what is referred to as a virtual tour.

CAD users access the invention through a plugin added to a 3$^{rd}$ party CAD software. These users can create or select proxy objects from within the 3D object database, view product data for HD objects and swap objects from the 3D object database directly within a CAD model. Non-CAD users access the invention through a website or mobile app using the 360 viewer software. These users can view panoramic images and move from one panoramic image to another as if they are walking through a space. In addition, non-CAD users are able to select objects (virtual images or photographic images) from within the 360 viewer software to view product information, select optional items or swap objects or colors based on configuration settings established in the business logic. CAD (computer-aided design) software is 3$^{rd}$ party software that is used by architects, engineers, drafters, artists, and others to create precision drawings or technical illustrations. CAD software can be used to create two-dimensional (2-D) drawings or three-dimensional (3-D) models of objects or buildings. The invention has software integration with 3$^{rd}$ party CAD software to facilitate the process of developing, managing and swapping proxy objects along with managing all related product data (including product information, installation guides and videos, warranty information, safety data sheets and any other information that a manufacturer or users chose to associate with the 3D object). The product data can be attached to any object in a CAD model or any object represented in a photographic image. The product data can be changed dynamically in the database and automatically updated in the visual representation.

A user, with appropriate permissions, can manage the Product Lifecycle by updating the Product Data directly in the database. Once the updated Product Data is approved as defined in the manufacturer's workflow, the updated Product Data is automatically updated in the CAD Models and 360 Viewer. The system retains all changes to both the 3D Objects and all Product Data enabling users, with appropriate permissions, to view prior versions of a 3D Object or Product Data. The user can attach an effective date when the new 3D Object or Product Data will become effective or will become obsolete. Additionally, a user with the appropriate permissions can identify a different 3D Object or Product Data that will replace a current 3D Object or Product Data.

Rendering software is 3$^{rd}$ party software that is used by architects, engineers, drafters, artists, and others to create photo realistic images from CAD models or objects and buildings. The rendering software can produce images in real time or at specific times as requested by the user. The invention has software integration with 3$^{rd}$ party rendering software to facilitate the process of creating photo realistic images for use in the 360 viewer software.

Referring to FIG. 2 the 3D objects database stores all the product CAD models which include proxy objects and HD objects. Each object contains meta data that connects the proxy objects to the related product content. Proxy objects are light weight representation of a HD object. Is uses fewer polygons to represent the object making the file size smaller than the HD object. Proxy objects allow CAD users to place a generic representation of a HD object in a CAD model. Since a proxy object is only a representation of a HD object the CAD user does not have enough information within the object to copy the content owner's IP. The firewall segregates the proxy objects from the HD objects to protect the content owner's IP through a data vault. The HD objects are held behind the firewall in the data vault and are only accessible by the content owner and their designated users while the proxy objects are made available to all users. HD Objects are detailed CAD objects that contain technical details on how the object is constructed, detailed dimensions, materials, textures and all supporting data needed to produce a photo realistic image of an object. Meta data connects the product information with the 3D objects and is also used to sort and filter data for end users. The meta data is used to connect the proxy objects with the HD objects across the firewall while protecting the HD objects in the data vault.

Referring to FIG. 3 a company set up is managed within the business unit logic and manages information for a specific company. The business unit hierarchy is defined for each company and establishes the relationships within a company. For example, a company may be structured geographically into continents, countries, regions, divisions and products or a company may be structured around products and then geographically. The business unit hierarchy provides the flexibility to structure data and user access based on each individual company's needs. If the company does not produce products that will be included in the product database, the user can skip that step in the setup of a new company. The product hierarchy works very similar to the business unit hierarchy but manages product information into categories, sub-categories, sub-sub-categories—all of which are based on the product meta data. This structure assists with sorting and filtering of data within the product catalog. Each manufacturer's product data is mapped to the product hierarchy within the invention. The product hierarchy is dynamic and can be modified at any time by users with the appropriate user permissions making it easy for a user to view the product data in a hierarchy view that works best for each individual user. FIG. 14, illustrates two examples of how a user can use the Meta Data to structure the view of Product Data into a different hierarchy to meet a user's specific needs. The folder structure is dynamically created based on the user's requirements and is simply a view into the data and not hard wired. This enables each user to customize their view of the data without compromising the overall structure of the data or other users' views of the same data. The business logic manages the process for creating new users and user permissions. Users are assigned to a level within the business unit hierarchy and their permissions within the system are assigned by user groups which specify what information users can access and whether they have rights to simply view the data, edit data or add/delete data. Once a new company is created and the users are created, the system emails credentials to each new user.

Referring to FIG. 4 a CAD user, with appropriate permissions, can create a HD Object using the 3$^{rd}$ party CAD software with the invention's software plugin. The CAD user creates a detailed CAD model for the object to accurately represent the real objects in all respects. Once the HD object is created, the CAD user can create the proxy object with all the required data (including materials, textures and IES lighting information if applicable). In addition, the CAD user can add the applicable meta data to the proxy object. Once the HD Object and proxy object are complete, the CAD user exports the objects to the 3D Object database. When the objects are uploaded to the 3D content database, the system automatically connects the objects to the relevant product data in the product database or to a manufacturer's remote database through the meta data. The invention includes a workflow management feature to manage the approval of new or modified content in the 3D and product databases. In addition, the user can create Assemblies which group multiple 3D Objects into a single group or "Assembly". This allows a CAD user or non-CAD User to view product information at the Assembly level or drill down into the individual 3D objects to view each 3D Objects specific product data. FIG. 15 provides an example of an Assembly which is a collection of 3D Objects that are grouped together. The Assembly combines related 3D Objects with their associated Product Data and enables a user to create Meta Data and Product Data for the Assembly in addition to the Meta Data and Product Data associated with each 3D Object. Upon review and approval of the new or modified content, the user (with appropriate permissions) can release the content for public consumption by CAD users and non-CAD users.

Referring to FIG. 5, users with the appropriate permissions must login to the systems website before adding product data to the product database. When the user logs into the website, the business logic validates the user's credentials before allowing the user to move forward. The user can select to enter product data one item at a time directly into a data screen on the website or they may select to upload data in bulk. If the user selects to upload data, the system (based on the company settings) will either initiate an automated process through the Product Data API with the user's company system or allow the user to upload data through a pre-formatted spreadsheet. In the case of uploading data, the system will prompt the user to browse to the file location for the pre-formatted spreadsheet containing the data to be uploaded. Once the user has selected the appropriate file to upload, they will click "ok". The system will also prompt the user to browse to the file location for the supporting documents and images to be uploaded. Once the user has selected the appropriate folder, the user will click "ok". If the user selects to manually enter data for a product, the system will display all product fields that can be entered. The user will enter all relevant product information and then click "ok". The user will then be prompted to browse to the location of the supporting product images and content. After selecting the content to upload, the user will click "ok". The system will validate all data entered by the user meets the required criteria and then the user will be prompted to review the information prior to clicking "Add to Database". Once the user has clicked add to database, the system will update the database with the information provided via the upload or manual process and will add the product images and content to the database. The invention includes functionality to manage the Product Lifecycle by tracking all changes to 3D Objects and Product Data. The invention includes a workflow management feature to manage the approval of new or modified content in the 3D and product databases. Upon review and approval of the new or modified content, the user (with appropriate permissions) can release the content for public consumption by CAD users and non-CAD users.

Referring to FIG. 6, the CAD user starts the CAD software and loads the appropriate CAD model. The CAD user logs into the database where the system validates the user's permissions. The user can then open the product catalog from within the CAD software. The user can browse, search and filter on meta data to find the desired object to add to the CAD model. The user can decide if they want to see the product data or simply select the product based on the summary information provide on the initial screen of the catalog for an object. If the user clicks on the object, they will see the product data and any associated images and product content in the system which is viewed as a 3D Specification. Once the user has found the object they want, they simply select the object and then place within the model.

Referring to FIG. 7, the CAD user starts the CAD software and opens the desired CAD model. The CAD user logs into the database where the system validates the user's permissions. The CAD user selects the object within the CAD model that they want to swap and then click on the menu item to swap object. The system will launch the product catalog and take the user to the correct product category and sub-category based on the meta data of the current object in the CAD Model. The user is able to browse, search and filter on meta data to find the desired object to replace in the CAD model. The user can decide if they want to see the product data or simply select the product based on the summary information provide on the initial screen of the catalog for an object. If the user clicks on the object, they will see the product data and any associated images and product content in the system which is viewed as a 3D Specification. The CAD user selects the object to replace in the CAD Model and the system then swaps the original object with the new object along with all meta data.

Referring now to FIG. 8 the system generates interactive 360 views through the 360 viewer software for end users to interact with virtual or photographic 360 images. All users can select objects from within the 360 viewer software that contain product information and/or have the option to swap the standard object for an optional object. A user simply taps or clicks on the object they want to swap. The user can browse the product catalog once they have selected the object they want to swap. The system will launch the product catalog and take the user to the correct product category and sub-category based on the meta data of the object selected by the user. The business logic contains rules that manage mutually exclusive objects, object packages (one object change may require the change of additional objects) and other rules that ensure a user is configuring an object properly. The user is able to browse, search and filter on meta data to find the desired object to replace in the interactive viewer. If the user clicks on the object, they will see the product data and any associated images and product content in the system. If the user clicks on the object, they will see the product data and any associated images and product content in the system which is viewed as a 3D Specification. The user selects the object to replace in the CAD Model and the system then swaps the original object with the new object along with all meta data. The CAD Model related to the view is found in the 3D Content database. The System will check to see if the Object(s) requested have been rendered previously and, if so, display the previously rendered Scene. If not, the 360 View Meta Data is used to retrieve the specific camera in the CAD Model. The spherical coordinates of the desired Object in the view are used to retrieve the 3D coordinates in the CAD Model. When the object is localized, it is swapped with the object the User has selected. The SDK of the 3$^{rd}$ party CAD software is used so there is no need to open the file to modify its content. Once the Object has been swapped in the CAD Model, the Scene is rendered. Through the SDK of the 3$^{rd}$ party rendering software, the System interprets the information that needs to be rendered and sends that information to the 3$^{rd}$ party rendering software to be rendered. While the system is rendering, the User can navigate through the 360 scenes and a buffer bar shows the percentage of time left for the rendering. When the new 360 rendered Scene is ready, the system will update the Scene for the User. The System stores previously rendered scenes to enable the User to go back to a previous configuration without having to render the scene again. The Product Data is attached in the new Object from the Product Content database in the form of a 3D Specification and is available for the User.

Referring to FIG. 9 a Proxy Object is a representation of a product and is not a purchasable item. The Proxy Meta Data is generic and not specific to a single manufacturer or product. This enables the CAD User to simply place the kitchen faucet proxy object in a CAD Model in the correct location. The Proxy Object also contains Meta Data which connects the Proxy Object to one or more HD Objects. By way of example, the Meta Data manages the relationship between Proxy Objects and HD Objects. The Meta Data structures data through the product hierarchy into product category, sub-category and sub-sub-category. As an example FIG. 9 image 9.1 shows a Proxy Object of a faucet. The associated Meta Data for this Proxy Object is Category—Plumbing; Sub-Category—Faucets; Sub-Sub-Category—Kitchen. Of note, the Meta Data associated with the Proxy Object is generic and only serves to categorize the Object in the product hierarchy.

A product information example is also considered Meta Data but is specific to a manufacturer and a specific product. The Product Information is connected to a product that can be purchased and contains information like but not limited to; manufacturer, product name, SKU, description, finish and style. The Product Information is converted into a 3D Specification. Each HD Object is connected to the appropriate Product Information and to the Product Hierarchy through Meta Data. This connection enables the system to match a single Proxy Object with Multiple HD Objects and allows a single HD Object to be connected to the appropriate Product Information.

Referring to FIG. 10, an example of swapping an object in the 360 viewer software is depicted. The User selects an Object within the 360 Viewer Software that they want to swap. The illustration on FIG. 10 shows a kitchen faucet selected. Once the User selects the Object, the System shows the alternative Objects available to swap. The User selects the Object to replace the Object selected or can view detailed product information. When the User selects a specific Object from the Product Catalog, the System will display detailed product information in the form of a 3D Specification.

Referring to FIG. 11, swapping object in CAD model example with a model kitchen scene is when User selects the object within the CAD Model to swap and navigates through the product catalog to find the HD Object they want to swap to. The System loads the Proxy Object. Once the System has replaced the generic Proxy Object with a specific Object, the System can send the Scene to the 3$^{rd}$ Party rendering software to render. FIG. 11.2 shows an example of a rendered Scene. The CAD User can continue to swap objects in the CAD Model and see the results of each selection when rendered by the 3$^{rd}$ Party rendering software. FIG. 11.3 shows an example of a 2$^{nd}$ Object rendered in the kitchen scene.

Referring to FIG. 12, the relationship between HD Objects and Proxy Objects is illustrated. The Meta Data for the Product Hierarchy connects the Proxy Objects to the HD Objects. FIG. 12 illustrates some of the Meta Data captured by the System but is not a complete list of data. Additionally, the System is dynamic and supports adding additional Meta Data over time.

The CAD model contains floor plan and panoramic camera information and object Meta Data. All objects with Meta Data will be shown in the virtual tour. The System collects all the 3D coordinates (x,y,z) of the centroids of the bounding boxes of every relevant object that will appear in the Scenes within the 360 viewer software, i.e., those that contain metadata. The coordinates must be retrieved in the global system of the 3D Model.

n=0 . . . N−1, n=index of object in model,

N=total number of relevant objects

Centroid: $p_n=(p_{xn}, p_{yn}, p_{zn})$,

The System collects all 3D camera positions in global coordinates (x,y,z). Each camera has a local system of coordinates defined by three vectors: right ($\vec{R}$), up ($\vec{U}$), and direction ($\vec{D}$), with respect to the global system of coordinates. Using these vectors and the 3D camera position (c), the system programmatically calculates the roto-translation matrix (R|T) for every camera (see 0056). This matrix represents the extrinsic parameters and the global pose of the camera, and they will be useful to project the 3D coordinates of an object to 2D pixel coordinates in the domain of a specific camera.

$$m = 0...M - 1, m = \text{index of camera in model,}$$

$$M = \text{total number of cameras}$$

$$\vec{R_m} = (R_{xm}, R_{ym}, R_{zm}), \vec{U_m} = (U_{xm}, U_{ym}, U_{zm}),$$

$$\vec{D_m} = (D_{xm}, D_{ym}, D_{zm}), c_m = (c_{xm}, c_{ym}, c_{zm})$$

$$-\vec{R_m} \cdot c_m = (-R_{xm})c_{xm} + (-R_{ym})c_{ym} + (-R_{zm})c_{zm}$$

$$R|T_m = \begin{pmatrix} R_{xm} & R_{ym} & R_{zm} & -\vec{R_m} \cdot c_m \\ U_{xm} & U_{ym} & U_{zm} & -\vec{U_m} \cdot c_m \\ D_{xm} & D_{ym} & D_{zm} & -\vec{D_m} \cdot c_m \\ 0 & 0 & 0 & 1 \end{pmatrix}$$

The CAD model contains floor plan and panoramic camera information and object Meta Data. All objects with Meta Data will be shown in the virtual tour. The System collects all the 3D coordinates of the centroids of the bounding boxes of every relevant object that will appear in the Scenes within the 360 viewer software, i.e., those that contain metadata. The coordinates must be retrieved in the global system of the 3D Model.

The system programmatically converts the 3D spatial coordinates of each object with Meta Data to 2D pixel coordinates in the render image. The System differentiates between floorplan and panoramic cameras.

For floorplan cameras, the System sets the projection to parallel (focal length=infinite), since floor plan cameras are placed in a Top view, and runs a ray cast algorithm through all the panoramic cameras. If a query camera is seen, the System can transform directly the coordinates of the camera from 3D to 2D using the render viewport screen coordinates. The query point in the screen viewport matches with the query pixel in the render image.

For panoramic cameras, the System sets the field of view to 360 degrees and runs a ray cast algorithm through all the objects with Meta Data. If an object is seen, the System converts the 3D global coordinates of the object ($p_n$) to the local system of the query camera ($p'_n$) using its R|T matrix.

$$p'_n = R|T_m p_n$$

Then it projects these 3D local coordinates to 2D texture coordinates using cube mapping (see ANNEX 1). Finally, the System converts from cubic to equirectangular coordinates (Cartesian to polar).

When the 2D coordinates are calculated, the System starts the rendering. Floorplan cameras are rendered in parallel projection and matches the viewport size used for coordinates calculation. Panoramic cameras are rendered in perspective projection with a FOV=360°, and the result are equirectangular images that match the 2D coordinates.

The set of 2D coordinates are assigned to their corresponding images and the Virtual Tour is generated with icons and links to the Meta Data for each object.

The Virtual Tour is created through the 360 visualization software automatically. Once created, the System saves the resulting files and publishes the virtual tour with a unique URL.

ANNEX 1 - XYZ to cubic UV

```
void convert_xyz_to_cube_uv(float x, float y, float z, int
*index, float *u, float *v)
{
  float absX = fabs(x);
  float absY = fabs(y);
  float absZ = fabs(z);
  int isXPositive = x > 0 ? 1 : 0; int
  isYPositive = y > 0 ? 1 : 0; int
  isZPositive = z > 0 ? 1 : 0;
  float maxAxis, uc, vc;
  // POSITIVE X
  if (isXPositive && absX >= absY && absX >= absZ) {
    // u (0 to 1) goes from +z to -z
    // v (0 to 1) goes from -y to +y
    maxAxis =
    absX; uc = -z;
    vc = y;
    *index = 'RIGHT';
  }
  // NEGATIVE X
  if (!isXPositive && absX >= absY && absX >= absZ) {
    // u (0 to 1) goes from -z to +z
    // v (0 to 1) goes from -y to +y
    maxAxis =
    absX; uc = z;
    vc = y;
    *index = 'LEFT';
  }
  // POSITIVE Y
  if (isYPositive && absY >= absX && absY >= absZ) {
    // u (0 to 1) goes from -x to +x
    // v (0 to 1) goes from +z to -z
    maxAxis = absY;
    uc = x;
    vc = -z;
```

ANNEX 1 - XYZ to cubic UV

```
    *index = 'TOP';
  }
  // NEGATIVE Y
  if (!isYPositive && absY >= absX && absY >= absZ) {
    // u (0 to 1) goes from -x to +x
    // v (0 to 1) goes from -z to +z
    maxAxis = absY;
    uc = x;
    vc = z;
    *index = 'BOTTOM';
  }
  // POSITIVE Z
  if (isZPositive && absZ >= absX && absZ >= absY) {
    // u (0 to 1) goes from -x to +x
    // v (0 to 1) goes from -y to +y
    maxAxis =
    absZ; uc =
    x;
    vc = y;
    *index = 'FRONT';
  }
  // NEGATIVE Z
  if (!isZPositive && absZ >= absX && absZ >= absY) {
    // u (0 to 1) goes from +x to -x
    // v (0 to 1) goes from -y to +y
    maxAxis =
    absZ; uc = -
    x;
    vc = y;
    *index = 'BACK';
  }
  // Convert range from -1 to 1 to 0 to 1
  *u = 0.5f * (uc / maxAxis + 1.0f) * panorama_width;
  *v = panorama_width - 0.5f * (vc / maxAxis + 1.0f) *
  panorama_width;
}
```

TERMS DEFINED: 360 View is a panoramic view including 360° horizontal view and 180° vertical view for a virtual or photographic image. 3D Specifications is a method of combining product information into a visual format that can be accessed directly by clicking on an Object within a CAD Model or by clicking on an Object within the 360 viewer software.

3D Specifications are a visual representation of Product Data that can include, but not limited to, product specifications, product photos or videos, installation guides, care and maintenance guides, safety data sheets or any other information that can be associated with a product.

Assembly is a group of objects that grouped into a single group or "Assembly". This allows a CAD user or non-Cad User to view product information at the Assembly level or drill down into the individual 3D objects to view each 3D Objects specific product data.

Bounding box is a box with the smallest volume within an Object lies. Centroid is the center of mass of a Bounding Box.

CAD Model is computer file used by CAD software programs and contains 2D or 3D graphical information for buildings and the objects within buildings. CAD Models are used to create the construction drawings used to construct buildings and more recently used to create photo realistic renderings of views within the CAD Model. CAD User is a user that is accessing the System through a third-party CAD software.

Camera pose is the combination of position and orientation of the camera within a 3D space, relative to the global coordinate system.

Building Information Model "BIM" is a 3D CAD Model that includes information about a building and objects within the building.

Computer Aided Design ("CAD") is a software platform that allows users to create virtual models of buildings, landscapes, products, etc.

Computer Graphic Image ("CGI") is the final output used for representing a virtual object or scene.

Data Vault is a secure data base that contains HD Objects and related product information for manufacturers, and restricts access to this information to authorized users from a manufacturer. HD Object is a detailed CAD file with all supporting data needed to produce a photo realistic image of an object.

Meta Data refers to data associated with a Proxy Object or an HD Object. Meta Data is used to connect Proxy Objects to one or more HD Objects and is used to allow users to browse, sort and filter information in the Product Catalog.

Non-CAD User is a user of the System who accesses the System without using a third-party CAD software.

Object is used to include Proxy Objects and HD Objects collectively.

Plugin is specific software within the System that is installed within 3rd party software.

Poly Count refers to the number of polygons used to create an object within a CAD Model.

Product Catalog is the collection of all HD Objects and related product data within the System.

Product Category Hierarchy is a data hierarchy used to categorize and map Proxy Objects to HD Objects.

Product Data is a general term referring to all information associated with a specific product. The Product Data is converted into 3D Specifications through the invention.

Product Data API is specific application programming interface to connect a manufacturer's Product Data which is stored in a remote database with the 3D Objects and Meta Data contained within the invention.

Product Lifecycle refers to the evolution of a product's 3D Object and or Product Data over time. As an example, manufacturers routinely update features or components within a product but don't change the SKU. The Product Lifecycle manages the changes in the product over time and includes effective dates for a product to be released or retired and may include suggested replacement products when a product is discontinued.

Proxy Object is an object placed in a CAD Model which is used to connect an object to Product Data. A Proxy Object may include a light weight representation of an object which uses fewer polygons to represent the object, making the file smaller than the HD Object.

Remote Database is a database controlled by a third party, like a manufacturer, where the third party manages Product Data.

Render is the final visual output once the rendering process is complete.

Rendering is the process of applying materials, lighting, reflections and shading to a CAD scene to create a photo realistic image.

Scene is a view from within a CAD file which is used to create the visual output.

System refers to all elements as depicted in FIG. 1.

Virtual Model is a collection of scenes within a single CAD file which can represent a home, building, product or environment.

User is used to refer to all Users of the System.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements, possesses those one or more steps or elements, but is not limited to possessing only those one or more elements. Likewise, a step of a method or an element of a device that "comprises," "has," "includes" or "contains" one or more features, possesses those one or more features, but is not limited to possessing only those one or more features. Furthermore, a device or structure that is configured in a certain way is configured in at least that way, but it may also be configured in ways that are not listed.

One skilled in the art will readily appreciate that the present invention is well adapted to carry out the objectives and obtain the ends and advantages mentioned, as well as those inherent therein. The embodiments, methods, procedures and techniques described herein are presently representative of the preferred embodiments, are intended to be exemplary, and are not intended as limitations on the scope. Changes therein and other uses will occur to those skilled in the art which are encompassed within the spirit of the invention and are defined by the scope of the appended claims. Although the invention has been described in connection with specific preferred embodiments, it should be understood that the invention, as claimed, should not be unduly limited to such specific embodiments. Indeed, various modifications of the described modes for carrying out the invention which are obvious to those skilled in the art are intended to be within the scope of the following claims.

What is claimed is:

1. A computer driven method of managing Proxy Objects comprising the steps of:

uploading HD Objects by a computer device having a memory to an accessible secure database; attaching meta data by an application executing on the computer device to each HD Object stored in said secure database;

matching each Proxy Object by an application executing on the computer device to at least one or more HD Objects using a product category hierarchy;

locating a Proxy Object from said secure database to include in a CAD Model;

placing said selected Proxy Object by an application executing on the computer device in an appropriate position within said CAD Model;

selecting a scene to render and saving the rendered scene into memory by an application executing on the computer device;

selecting HD Objects to replace selected Proxy Objects on said scene;

swapping the selected Proxy Objects for the selected HD Objects by an application prior to rendering;

displaying a computer generated, photo realistic rendered image of the scene with the selected HD Objects swapped for the Proxy Objects;

displaying photo realistic rendered images of multiple scenes with HD Objects, placing said selected 3D Specification icon by an application executing on the computer device in an appropriate position within said CAD Model or 2D Image and 3D Specifications for Users to access of the internet via a browser or mobile app; and connecting said Meta Data for said Proxy Object or said HD Object to said 3D Specification.

2. The method of managing Proxy Objects according to claim 1, wherein said meta data includes manufacturer specific information along with a product category and sub-category identification.

3. The method of managing Proxy Objects according to claim 1, wherein said step of selecting an HD Object to replace each Proxy Object is performed from a user interface outside a CAD Model.

4. The method of managing Proxy Objects according to claim 1, including the step of saving the scene with the selected HD Objects.

5. The method of managing Proxy Objects according to claim 1, wherein one Proxy Object can be associated with a plurality of HD Objects.

6. The method of managing Proxy Objects according to claim 1, wherein said database is remotely stored and accessible using the internet.

7. The method of managing Proxy Objects according to claim 1, including the step of managing Meta Data, wherein 3D Specifications are available outside of a CAD Model but connected visually to the HD Objects.

8. The method of managing Proxy Objects according to claim 1, including the step of creating 360 experiences through the system and the 360 viewer software, wherein a User can navigate through multiple scenes, swap Objects and view 3D Specifications without specialized hardware or software.

9. The method of managing Proxy Objects according to claim 8 wherein said panoramic cameras set to a 360 degree field of view runs a ray cast algorithm through all the objects with Meta Data according to the following:

$$p'_n = R|T_m p_n.$$

10. The method of managing Proxy Objects according to claim 8 including the step of collecting 3D coordinates of centroids of bounding boxes of every relevant object that will appear in the scene within the 360 viewer software containing metadata wherein the centroids are calculated to:

$$p_n = (p_{xn}, p_{yn}, p_{zn}),$$

and n=0 . . . N−1, n=index of object in model, N=total number of relevant objects.

11. The method of managing Product Data according to claim 1 including the step of using Meta Data to enable Users to control the menu structure of 3D Objects and Product Data that are presented to Users through the CAD model.

12. The method of managing Proxy Objects according to claim 1 wherein meta data is connected through a Remote Database to a 3D object in said CAD model or an object identified in a photograph.

13. The method of managing Proxy Objects according to claim 1 including the step of collecting camera poses and analyzing which 3D objects with meta data can be seen from each camera.

14. The method of managing Proxy Object according to claim 1 including the step of managing Assemblies of 3D Objects which enable users to view product data for an Assembly or individual products that make up the Assembly.

* * * * *